United States Patent [19]

Katoh

[11] Patent Number: 5,768,176

[45] Date of Patent: Jun. 16, 1998

[54] METHOD OF CONTROLLING NON-VOLATILE FERROELECTRIC MEMORY CELL FOR INDUCING A LARGE AMOUNT OF ELECTRIC CHARGE REPRESENTATIVE OF DATA BIT

[75] Inventor: Yuukoh Katoh, Tokyo, Japan

[73] Assignee: NEC Corporation, Tokyo, Japan

[21] Appl. No.: 870,824

[22] Filed: Jun. 6, 1997

[30] Foreign Application Priority Data

Jun. 6, 1996 [JP] Japan ................... 8-143925

[51] Int. Cl.⁶ ............................................. G11C 11/22
[52] U.S. Cl. .................... 365/145; 365/185.08; 365/117; 365/150
[58] Field of Search ............................ 365/145, 65, 149, 365/150, 185.08, 117

[56] References Cited

U.S. PATENT DOCUMENTS

| | | | |
|---|---|---|---|
| 5,300,799 | 4/1994 | Nakamura et al. | 257/295 |
| 5,412,596 | 5/1995 | Hoshiba | 365/145 |
| 5,541,871 | 7/1996 | Nishimura et al. | 365/145 |
| 5,615,144 | 3/1997 | Kimura et al. | 365/145 |
| 5,621,680 | 4/1997 | Newman et al. | 365/145 |
| 5,633,821 | 5/1997 | Nishimura et al. | 365/145 |

FOREIGN PATENT DOCUMENTS

| | | |
|---|---|---|
| 3-32066 | 2/1991 | Japan . |
| 5-136378 | 6/1993 | Japan . |
| 5-304299 | 11/1993 | Japan . |

OTHER PUBLICATIONS

S. Shukuri et al., "Super-Low-Voltage Operation of a Semi-Static Complementary Gain DRAM Memory Cell", Digest Technical Papers of 1993 Symposium on VLSI Technology, pp. 23 and 24.

Primary Examiner—Tan T. Nguyen
Attorney, Agent, or Firm—Foley & Lardner

[57] ABSTRACT

A potential level is applied between both electrode of a capacitor so as to polarize a ferroelectric layer sandwiched between the electrodes, and, thereafter, the node between the capacitor and a field effect transistor is caused to enter the floating state so that a large amount of electric charge is induced in the node by virtue of both of the ferroelectric component and the paraelectric component of the capacitor.

6 Claims, 7 Drawing Sheets

METHOD OF CONTROLLING NON-VOLATILE FERROELECTRIC MEMORY CELL FOR INDUCING A LARGE AMOUNT OF ELECTRIC CHARGE REPRESENTATIVE OF DATA BIT

FIELD OF THE INVENTION

This invention relates to a method of controlling a non-volatile ferroelectric memory cell and, more particularly, to a method of controlling a non-volatile ferroelectric memory cell having a ferroelectric capacitor connected to a gate electrode of a field effect transistor for storing a data bit in the form of movable electric charge due to polarization of the ferroelectric layer of the capacitor.

DESCRIPTION OF THE RELATED ART

Various kinds of non-volatile memory cell have been proposed. A non-volatile memory cell has a ferroelectric capacitor connected to a gate electrode of a MIS (Metal Insulator Semiconductor) field effect transistor, and is called as "non-volatile ferroelectric memory cell".

FIG. 1 illustrates a typical example of the non-volatile memory cell disclosed in Japanese Patent Publication of Unexamined Application No. 3-32066. As shown in FIG. 8, heavily doped n-type impurity regions 1a and 1b are formed in a lightly doped p-type silicon substrate 1c, and a channel region between the heavily doped n-type impurity regions 1a and 1b is covered with a gate oxide layer 1d. The gate oxide layer 1d is stacked with a ferroelectric capacitor 2 which consists of a lower electrode 2a, a ferroelectric layer 2b and a control gate electrode 2c. Thus, a gate electrode is replaced with the ferroelectric capacitor 2, and the ferroelectric capacitor 2, the gate oxide layer 1d and the heavily doped n-type impurity regions form in combination the prior art non-volatile memory cell. The heavily doped n-type impurity regions 1a/1b and the ferroelectric capacitor 2 are covered with an inter-level insulating layer 3a, and a constant potential line 3b and a bit line 3c are held in contact through contact holes with the heavily doped n-type impurity regions 1a/1b, respectively.

When a data bit is written into the prior art non-volatile memory cell, a large potential difference is applied between the control gate electrode 2c and the lower electrode 2a so as to polarize the ferroelectric layer 2b. After the polarization, even though the large potential difference is removed from the prior art non-volatile memory cell, the remanence is left in the ferroelectric layer 2b, and induces movable electric charge in a surface portion of the lower electrode 2a. The movable electric charge in turn induces electric charge in the channel region, and changes the of the channel resistance. In other words, the prior art non-volatile memory cell changes the threshold between a high level and a low level depending upon the remanence. Thus, the data bit is stored in the form of remanence in the ferroelectric layer 2b.

When the data bit is read out from the prior art non-volatile memory cell, the control gate electrode 2c is biased to an intermediate level between the high threshold level and the low threshold level, and checks the potential level on the bit line 3c to see whether current flows through the channel region into the constant potential line 3b.

Another prior art non-volatile ferroelectric memory cell is disclosed in Japanese Patent Publication of Unexamined Application No. 5-304299. The prior art non-volatile ferroelectric memory cell is fabricated on a silicon substrate 4a. A source region 4b and a drain region 4c are formed in a surface portion of the silicon substrate 4a, and are spaced from each other by a channel region 4d. The channel region 4d is covered with a thin protective insulating layer 4e, and the thin protective insulating layer 4e is stacked with a lower electrode 4f, a ferroelectric layer 4g and an upper electrode 4h. Conductive lines VS, VD, VG1 and VG2 are connected to the source region 4b, the drain region 4c, the lower electrode 4f and the upper electrode 4h, respectively.

When a data bit is written into the prior art non-volatile ferroelectric memory cell, the conductive line VG1 is grounded, and a pulse of −Vcc is supplied to the conductive line VG2. After the application of the pulse, the conductive line VG1 enters into floating state. Then, the ferroelectric layer 4g is downwardly polarized, and the dielectric polarization takes place in the thin protective insulating layer 4e. As a result, holes are induced in the channel region 4d, and the channel region 4d becomes conductive.

On the other hand, the pulse of −Vcc is applied to the conductive line VG1, and the conductive line VG2 is grounded. When the conductive line VG1 is changed to the floating state, the ferroelectric layer 4g is upwardly polarized, and, accordingly, the dielectric polarization takes place in the thin protective insulating layer 4f. The channel region 4d becomes highly resistive. Thus, the data bit is stored in the prior art non-volatile ferroelectric memory cell in the form of the remanence, and the remanence changes the channel conductivity type.

When the data bits is read out from the prior art non-volatile ferroelectric memory cell, potential level −Vcc is applied to the conductive line VD. If the ferroelectric layer 4g is downwardly polarized, the channel region 4d is conductive, and drain current flows into the conductive line VS. On the other hand, if the ferroelectric layer 4g is upwardly polarized, the channel region 4d is highly resistive, and only negligible current flows through the channel region.

FIG. 3 illustrates the circuit configuration of the prior art non-volatile memory device disclosed in Japanese Patent Publication of Unexamined Application No. 5-136378. Although two memory cell blocks are illustrated in FIG. 4, description is focused on the memory cell block associated with a bit line BL1. The other memory cell block associated with a bit line BL2 has the same circuit configuration as the memory cell block associated with the bit line BL1.

Ferroelectric capacitors FC1, FC2, . . . , FC6, FC7 and FC8 are respectively connected between the gate electrodes of field effect transistors Tr1, Tr2, . . . , Tr6, Tr7 and Tr8 and word lines WL0, WL1, WL2, . . . , WL6, WL7 and WL8, and a selecting transistor STr and the field effect transistors Tr1 to Tr8 are connected in series between a source of constant potential and a bit line BL1. Each of the ferroelectric capacitor FC1 , . . . or FC8 and the associated field effect transistor Tr1, . . . or Tr8 form in combination one of non-volatile ferroelectric memory cells MC1, MC2, . . . , MC6, MC7 and MC8. The gate electrodes of the field effect transistors Tr1 to Tr8 are further connected to word lines WL1' to WL8', respectively.

Assuming now that a data bit is written into the memory cell MC1, a positive potential is applied to the bit line BL1, and the other bit lines such as BL2 are grounded. The word line WL1 is grounded, and the word line WL1' is changed to open state. The other word lines WL2 to WL8 and WL2' to WL8' are biased to a positive potential level so that the field effect transistors Tr2 to Tr8 turn on.

The positive potential level on the bit line BL1 is propagated through the field effect transistors Tr8 to Tr2 to the drain node of the field effect transistor Tr1. Then, the ferroelectric capacitor FC1 is polarized, and the data bit is written into the memory cell MC1.

When the data bit is read out from the memory cell MC1, the bit line BL1 is connected to a sense amplifier (not shown). The sense amplifier is electrically isolated from the other bit lines BL2. The word line WL1 is grounded, and the word line WL4' is changed to the open state. The other word lines are biased to the positive potential level. The field effect transistors Tr8 to tr2 turn on, and the field effect transistor Tr1 provides either conductive or resistive channel depending upon the remanence of the ferroelectric capacitor FC1. If the field effect transistor Tr1 creates the conductive channel, current flow through the conductive channel to the constant potential source, and the sense amplifier detects a potential drop due to the current. On the other hand, if the field effect transistor Tr1 does not create the conductive channel, the current does not flow into the constant potential source, and the sense amplifier decides the potential level on the bit line BL1 to be constant. In this way, the potential level on the bit line BL1 is different depending upon the direction of polarization, and the sense amplifier determines the logic level of the stored data bit on the basis of the potential level on the bit line BL1.

Although a ferroelectric layer is not incorporated, another kind of memory cell is disclosed by Shoji Shukuri et. al. in "Super-Low-Voltage Operation of a Semi-Static-Complementary Gain DRAM Memory Cell", Digest Technical Papers of 1993 Symposium on VLSI Technology, pages 23 and 24. The gain DRAM cell is not categorized in the non-volatile memory cell.

FIG. 4 illustrates the gain DRAM cell. The gain DRAM cell consists of a p-channel type write-in MOS transistor WM and an n-channel type read-out MOS transistor RM. The n-channel type read-out MOS transistor RM is connected between a bit line BL and a constant potential source Vss, and a storage node SN is embedded in a gate insulating layer of the n-channel type read-out MOS transistor RM. The p-channel type write-in MOS transistor WM is connected between the bit line BL and the storage node SN, and both of the n-channel type read-out MOS transistor RM and the p-channel type write-in MOS transistor WM are gated by a word line WL.

The storage node SN forms a part of a paraelectric capacitor, and the paraelectric capacitor affects the channel region of the n-channel type read-out MOS transistor RM.

When a data bit is written into the gain DRAM cell, the word line WL is changed to a low level, and causes the p-channel type write-in MOS transistor to turn on. Positive electric charge is accumulated in the storage node SN, and the accumulated positive electric charge lowers the threshold of the n-channel type read-out MOS transistor RM. Thus, the data bit is stored in the gain DRAM cell in the form of electric charge, and changes the threshold of the n-channel type read-out MOS transistor RM between a high level and a low level.

On the other hand, when the data bit is read out from the gain DRAM cell, the word line WL is changed to a read-out potential level between the high threshold level and the low threshold level, and checks the bit line BL to see whether or not a drain current flows through the n-channel type read-out MOS transistor RM.

The accumulated electric charge is leaked from the storage node SN, and a remanence is never left in the paraelectric capacitor.

However, the prior art non-volatile ferroelectric memory cells encounter a problem in that variation of threshold is too narrow to exactly determine the logic level of a data bit. This is because of the fact that only the electric charge equivalent to the remanence affects the channel conductance or the threshold level.

The second problem, which relates to the above described first problem, is that the remanence gradually weakened together with repetition of the data read-out due to the read-out voltage applied to the control gate electrode.

The third problem is to lose the electric charge with time. The gate electrodes of the field effect transistors are connected to the source/drain regions of the switching elements. The gate electrodes of the field effect transistors are usually connected to source/drain regions of other field effect transistors. Although the p-n junctions of the source/drain regions are reversely biased, the electrical isolation is not perfect, and the electric charge is gradually leaked through the p-n junctions. Especially, the electric charge is decreased at a data read-out. For example, when a data bit is read out from one of the memory cells MC1 to MC8, the read-out potential level is applied to the word line WL1-WL8, and induces the positive electric charge in the gate electrode of the associated field effect transistor so as to positively bias the gate electrode. The positive potential does not produce a potential difference between both electrodes of the ferroelectric capacitor, nor destroys the polarization. However, the read-out potential induces the electric charge of the opposite polarity, and the induced electric charge evacuates the movable electric charge through the associated word line WL1' to WL8'.

The fourth problem is to lose the electric charge while the prior art non-volatile ferroelectric memory devices are powered off. In the prior art non-volatile ferroelectric memory devices shown in FIGS. 1 to 3, a potential is applied to the nodes between the ferroelectric capacitors and the gate electrodes of the field effect transistors, and field effect transistors bias the nodes through conductive lines. When the prior art non-volatile ferroelectric memory devices are powered off, the source/drain regions of the field effect transistors become equal in potential level to the conductive lines and the semiconductor substrates, and the electric charge passes through the conductive lines and the source/drain regions to the semiconductor substrates. After the evacuation of the electric charge, although the ferroelectric layers are still polarized, the variation of threshold is quite narrow, and a data read-out becomes difficult.

A problem inherent in the prior art gain DRAM cell is that a data bit is lost when the memory device is powered off. Therefore, the prior art gain DRAM cell is not a kind of non-volatile memory cell.

SUMMARY OF THE INVENTION

It is therefore an important object of the present invention to provide a method of controlling a non-volatile ferroelectric memory cell for enhancing reliability of the data storing capability of the cell.

In accordance with the present invention, there is provided a method of storing a data bit into a memory cell including a capacitor having a ferroelectric layer sandwiched between a first electrode connected to a word line and a second electrode, a field effect transistor having a gate electrode connected to the second electrode and providing one of a conductive channel and a resistive channel between a bit line and a constant potential line and a switching element connected between the gate electrode and a biasing source and gated by a control line, comprising the steps of:
a) causing the switching element to turn on so as to apply a potential difference between the first electrode and the second electrode; and b) causing the switching element to turn off without removal of the potential difference so that a electric charge is accumulated in the second electrode due to a ferroelectric induction and a paraelectric induction.

BRIEF DESCRIPTION OF THE DRAWINGS

The features and advantages of the method according to the present invention will be more clearly understood from the following description taken in conjunction with the accompanying drawings in which.

DESCRIPTION OF THE PREFERRED EMBODIMENTS

First Embodiment

Figure 1:
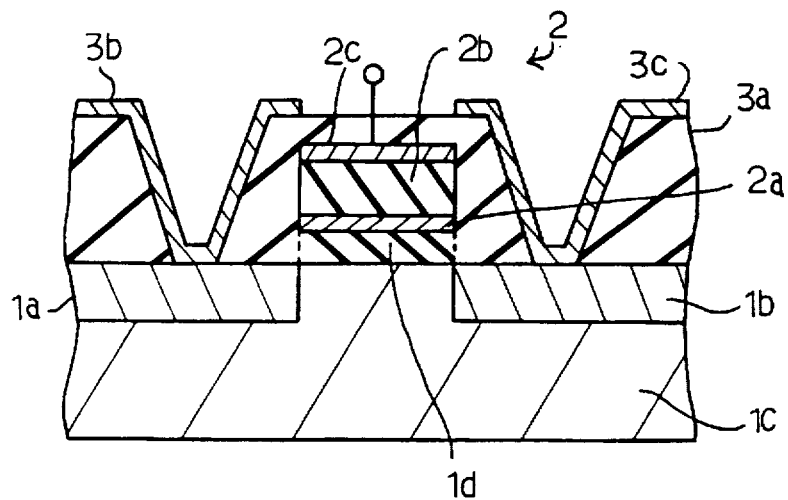
FIG. 1 is a cross sectional view showing the structure of the prior art non-volatile ferroelectric memory cell disclosed in Japanese Patent Publication of Unexamined Application No. 3-32066.
Figure 2:
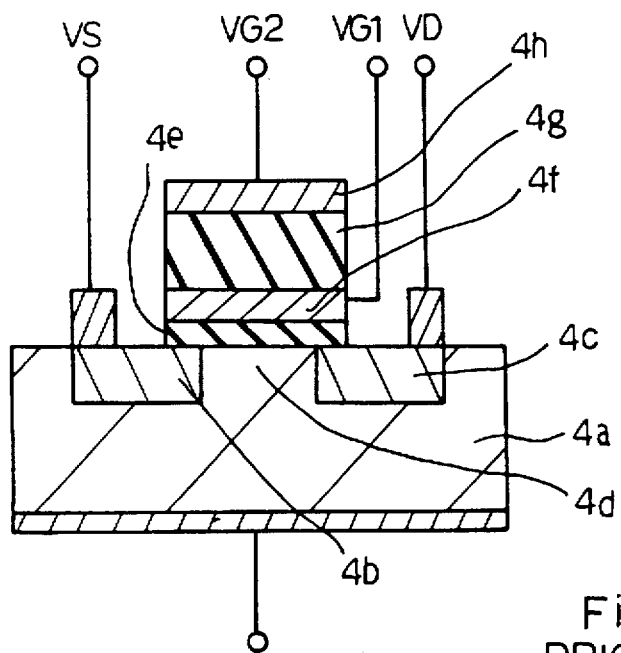
FIG. 2 is a cross sectional view showing the structure of the prior art non-volatile ferroelectric memory cell disclosed in Japanese Patent Publication of Unexamined Application No. 5-304299.
Figure 3:
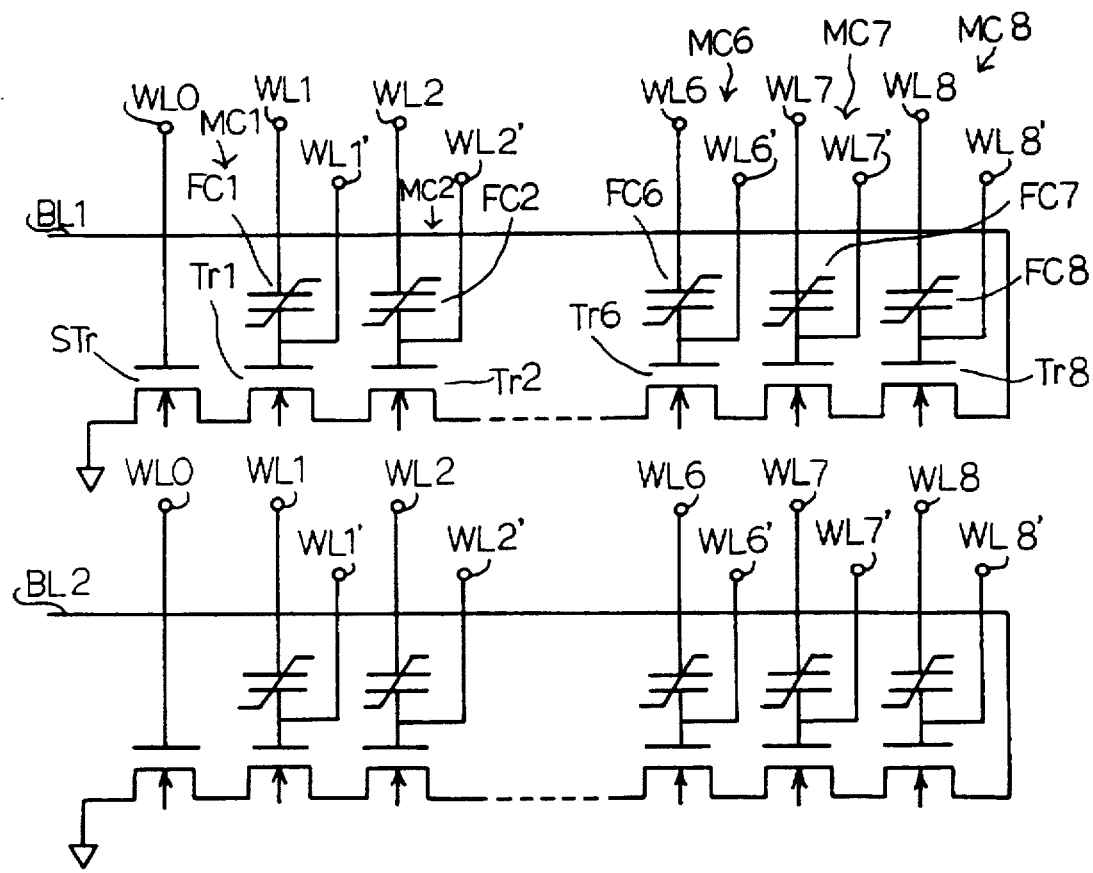
FIG. 3 is a circuit diagram showing the arrangement of the prior art non-volatile ferroelectric memory cell disclosed in Japanese Patent Publication of Unexamined Application No. 5-136378.
Figure 4:
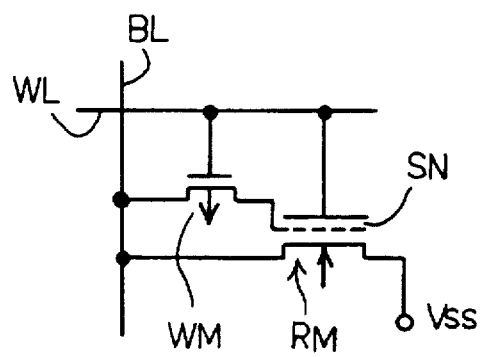
FIG. 4 is a circuit diagram showing the equivalent circuit of the prior art gain DRAM memory cell disclosed in the digest of technical papers of 1993 Symposium on VLSI Technology.
Figure 5:
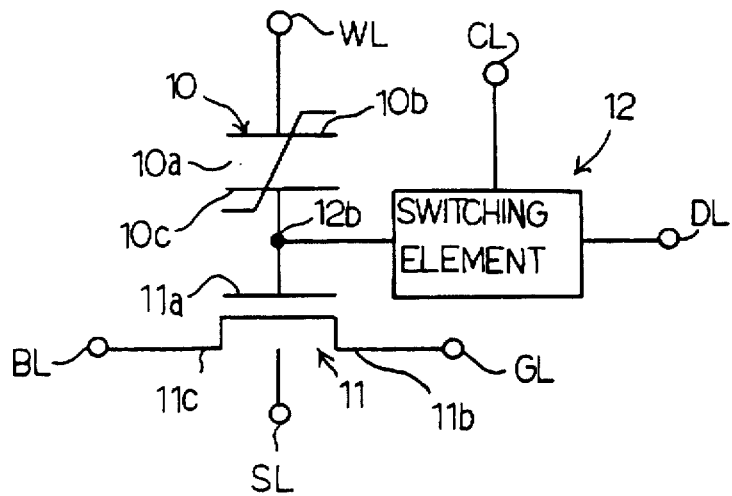
FIG. 5 is a circuit diagram showing the circuit configuration of a non-volatile ferroelectric memory cell according to the present invention.

FIG. 5 illustrates an essential part of a non-volatile ferroelectric memory cell embodying the present invention. The non-volatile ferroelectric memory cell comprises a ferroelectric capacitor 10, a field effect transistor 11 and a switching element 12. Although a switching transistor is incorporated in the memory cell for selecting the memory cell from a memory cell array, the switching transistor is not shown in FIG. 5.

The ferroelectric capacitor 10 has a ferroelectric layer 10a and two electrodes 10b/10c attached on both surfaces of the ferroelectric layer 10a. One of the electrodes 10b is connected to a word line WL, and the other electrode 10c is connected to the gate electrode 11a of the field effect transistor 11.

The field effect transistor 11 is fabricated on a semiconductor substrate or a well defined in the semiconductor substrate, and has a source node 11b and a drain node 11c. The source node 11b is connected to a constant potential source GL, and the drain node 11c is directly or indirectly connected to a bit line BL. The semiconductor substrate or the well is biased through a bias line SL. A conductive layer may be shared between the ferroelectric capacitor 10 and the field effect transistor 11 so as to serve as the electrode 10c and the gate electrode 11a. The afore-mentioned switching transistor is connected between the bit line BL and the field effect transistor 11.

Figure 6:
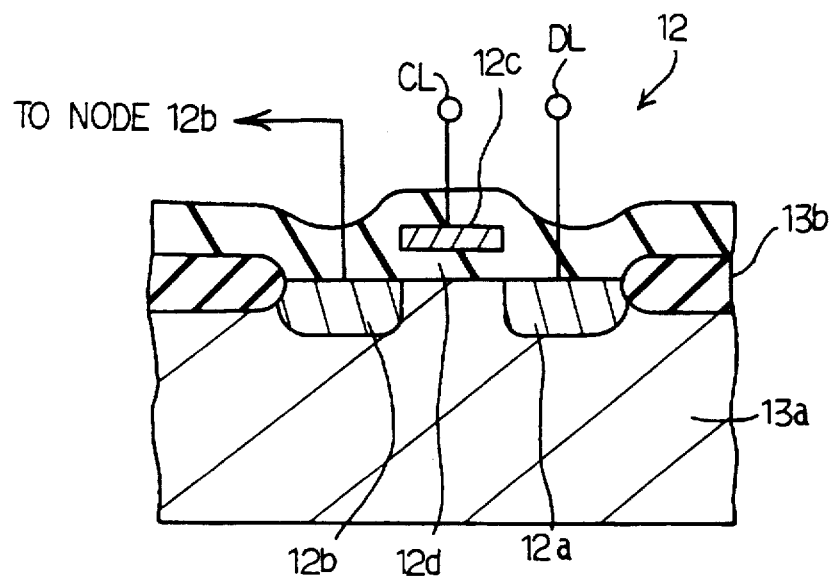
FIG. 6 is a cross sectional view showing the structure of a switching transistor incorporated in the non-volatile ferroelectric memory cell.

The switching element 12 is implemented by a field effect transistor as shown in FIG. 6, and the field effect transistor is also labeled with reference numeral 12 in the following description. The field effect transistor 12 is fabricated on the semiconductor substrate or another well 13a, and is electrically isolated from the field effect transistor 11 by means of a field oxide layer 13b. The field effect transistor 12 is gated by a control line CL so as to provide a conductive channel between a bias line DL and a node 12b. The bias line DL is connected to one of source and drain regions 12a/12b, and the node 12b is connected to the other of the source and drain regions 12a/12b. A gate electrode 12c is formed on a gate insulating layer 12d over a channel region between the source and drain regions 12a and 12b, and is connected to the control line CL.

The switching element 12 may be implemented by a parallel combination of a p-channel type field effect transistor and an n-channel type field effect transistor.

Figure 7:
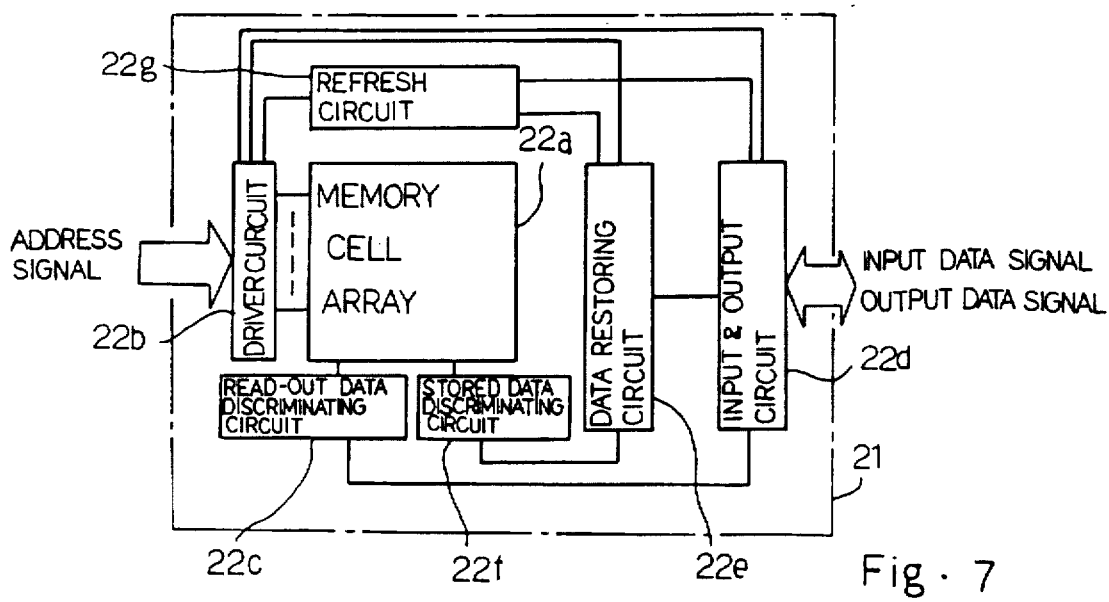
FIG. 7 is a block diagram showing the arrangement of a non-volatile ferroelectric memory device according to the present invention.

Using the memory cell shown in FIG. 5, a non-volatile ferroelectric memory device is fabricated on a semiconductor substrate 21 as shown in FIG. 7.

The non-volatile ferroelectric memory device comprises a memory cell array 22a, and a plurality of memory cells shown in FIG. 5 are arranged in matrix. The memory cell array 22a is accompanied with a driver circuit 22b, a read-out data discriminating circuit 22c, a data input/output circuit 22d, a data restoring circuit 22e, a stored data discriminating circuit 22f and a refresh circuit 22g, and these circuits 22b to 22g behave as follows.

The driver circuit 22g is connected to the word line WL, the control line CL, the bias lines DL/SL, the bit line BL and the constant potential source GL for each memory cell, and biases these lines to appropriate potential levels.

The read-out data discriminating circuit 22c is used in a data read-out operation. The memory cell stores a data bit in the form of channel conductance or the threshold of the field effect transistor 11, and the memory cell changes the amount of current passing through the field effect transistor 11 depending upon the threshold.

The read-out data discriminating circuit 22c monitors the current, and determines a data bit stored in the memory cell to be in logic "1" level or logic "0" level.

The data input/output circuit 22d produces an output data signal representative of the logic level of the data bit stored in the memory cell, and supplies the output data signal to the outside of the non-volatile ferroelectric memory device. The data input output circuit 22d is further operative to receive an input data signal supplied from the outside of the non-volatile ferroelectric memory device.

When the non-volatile ferroelectric memory device is powered on, the data restoring circuit 22e reads out the remanence from each of the memory cells, and restores the data bits stored at the previous power-off into the memory cells. The non-volatile ferroelectric memory device does not allow an external device to write a new data bit into the memory cell array 22a and read out the data bit therefrom until completion of the restoring operation.

The stored data discriminating circuit 22f discriminates the remanence left in the ferroelectric capacitors 10 in the memory cell array 22a during the restoring operation.

The refresh circuit 22g periodically refreshes the data bits stored in the memory cell array 22a after the restoring operation.

Data Write-in

A new data bit is stored in the memory cell as follows. The control line CL causes the switching element 12 to turn on, and the bias line DL is connected to the node 12b.

A potential difference is applied between the word line WL and the bias line DL so as to polarize the ferroelectric layer 10a. The control line CL causes the switching element 12 to turn off before removal of the potential difference, and the node 12b is isolated from the bias line DL. It is allowed to change the potential difference before the isolation of the node from the bias line DL in so far as the polarity is not changed or the potential difference is decreased to zero. The biasing operation is carried out for at least one of the two polarities of potential; in case of the other polarity, the potential difference applied to the ferroelectric capacitor 10 is changed to zero, and, thereafter, the node is caused to enter into the floating state. As a result, remanence is left in the ferroelectric layer 10a depending upon the applied potential and the potential at the node 12b after the entry into the floating state. Thus, electric charge is accumulated in the node 12b, and is as much as the total of the electric charge induced by the ferroelectric polarization component of the ferroelectric layer 10a and the electric charge of the electric charge induced by the paraelectric component associated with the gate electrode 11a. The paraelectric component associated with the gate electrode 11a contains the paraelectric capacitance of the ferroelectric capacitor 10, the capacitance produced between the gate electrode 11a and the semiconductor substrate and other parasitic capacitance coupled to the gate electrode 11a.

The electric charge induced by the paraelectric component is decreased with time due to leak current. However, if the ferroelectric layer 10a is formed of ferroelectric substance with a large paraelectric component, it is possible to increase the amount of accumulated electric charge induced by the paraelectric component rather than that of a standard paraelectric substance such as silicon oxide, and the data holding time is prolonged.

As will be understood from the foregoing description, the electric charge induced by the paraelectric component is accumulated in the node 12b, and is identical in polarity with the direction of polarization of the ferroelectric capacitor 10. Even though a read-out potential is applied to the word line WL in the opposite direction to the polarization of the ferroelectric layer 10a, the electric charge induced by the paraelectric component weakens the electric field created by the read-out potential, and, for this reason, the read-out potential does not seriously destroys the polarization of the ferroelectric layer 10a.

Data Read-out

When an external device accesses one of the memory cells, current is supplied through the bit line BL to the field effect transistor 11, and the driver circuit 22b biases the word line WL to the read-out potential level between the low threshold and the high threshold. If the field effect transistor 11 of the accessed memory cell has the low threshold, the field effect transistor 11 turns on so as to discharge the current from the bit line BL to the constant potential source SL, and a large amount of current flows through the bit line BL. On the other hand, if the field effect transistor 11 has the high threshold, the field effect transistor 11 is turned off, and only a negligible amount of current flows through the bit line BL. The read-out data discriminating circuit 22c monitors the current, and determines the data bit stored in the accessed memory cell to be in logic "1" level or logic "0" level. Thus, the data bit is read out from the accessed memory cell without destruction of the polarization.

Data Restoring

When the non-volatile ferroelectric memory device is powered off, most of the movable electric charge is gradually leaked with time. Even if the movable charge is lost, the ferroelectric layer 10a is still polarized, and the remanence is available for recovery of the data bit stored at the power-off. For this reason, the data restoring circuit 22e firstly instructs the stored data discriminating circuit 22f to check the remanence to see whether each memory cell stored a data bit of logic "1" level or a data bit of logic "0" level in cooperation with the driver circuit 22b.

When the stored data discriminating circuit 22f decides the memory cell to have been in the write-in state, the data restoring circuit 22e instructs the driver circuit 22b to polarize the ferroelectric layer 10a of the memory cell again, and the driver circuit 22b supplements the electric charge to the memory cell. While the stored data discriminating circuit 22f and the driver circuit 22b is restoring the data bit, the data storing circuit 22e prohibits an external device from writing a new data bit and reading out the data bit.

The remanence is checked as follows. The driver circuit 22b biases the word line WL and the bias line DL to the same potential level, and changes the control line CL to an active level. Then, the switching element 12 turns on, and the potential level is transferred from the bias line DL to the node 12b. Thereafter, the bias line DL is caused to enter into floating state, and the word line WL is lifted to a certain potential level. If the ferroelectric capacitor 10 is polarized in a direction opposite to the applied potential, the certain potential level causes an inversion of polarization to take place. If the inversion of polarization does not take place, the potential level on the bias line DL is changed to a potential level determined by dividing the potential level on the word line WL between the capacitance of the ferroelectric capacitor 10 and the parasitic capacitance of the bias line DL. On the other hand, if the inversion of polarization takes place, the induced electric charge changes the potential level on the bias line DL. The bias line DL propagates the potential level to the stored data discriminating circuit 22f, and the stored data discriminating circuit 22f compares the potential level on the bias line DL with a reference level so as to determine whether or not the memory cell was in the write-in state. The reference level is regulated to an intermediate value between the potential level without the inversion of polarization and the potential level affected by the inversion of polarization.

Another method for checking the ferroelectric capacitor 10 is similar to the above described method until the word line WL is lifted to the certain level. As described hereinbefore, a difference takes place at the node 12b between the inversion of polarization and the non-inversion of polarization. The potential level at the node 12b affects the channel conductance of the field effect transistor 11. For this reason, the difference of the potential level at the node 12b is discriminative as the amount of drain current passing through the field effect transistor 11. An appropriate bias may be applied to the word line WL.

When the direction of polarization in the ferroelectric layer 10a is determined, the data bit is stored in the memory cell again. The data bit is written into the memory cell as similar to the data write-in described hereinbefore. Upon completion of the data write-in sequence, the data restoring circuit 22e allows an external device to write a new data bit into and read out a data bit from the memory cell array 22a.

Thus, the data bits stored at a power-off are restored in the memory cell array 22a, and the ferroelectric memory device surely serves as a non-volatile memory device.

Data Refresh

A data refresh starts at expiry of a certain time period from the data restoring or the previous data refresh. Firstly, a data access from the out side is prohibited. Subsequently, a data read-out is carried out, and the read-out data bit is stored in the memory cell again. Thereafter, a data write-in and a data read-out are allowed.

The data read-out and the data write-in in the refreshing sequence are similar to the above described data read-out and the data write-in.

Thus, the data refresh is carried out before the expiry of the certain time period; even though the electric charge is decreased with time during the power-on state, the data bits are surely accessed.

Figure 8:
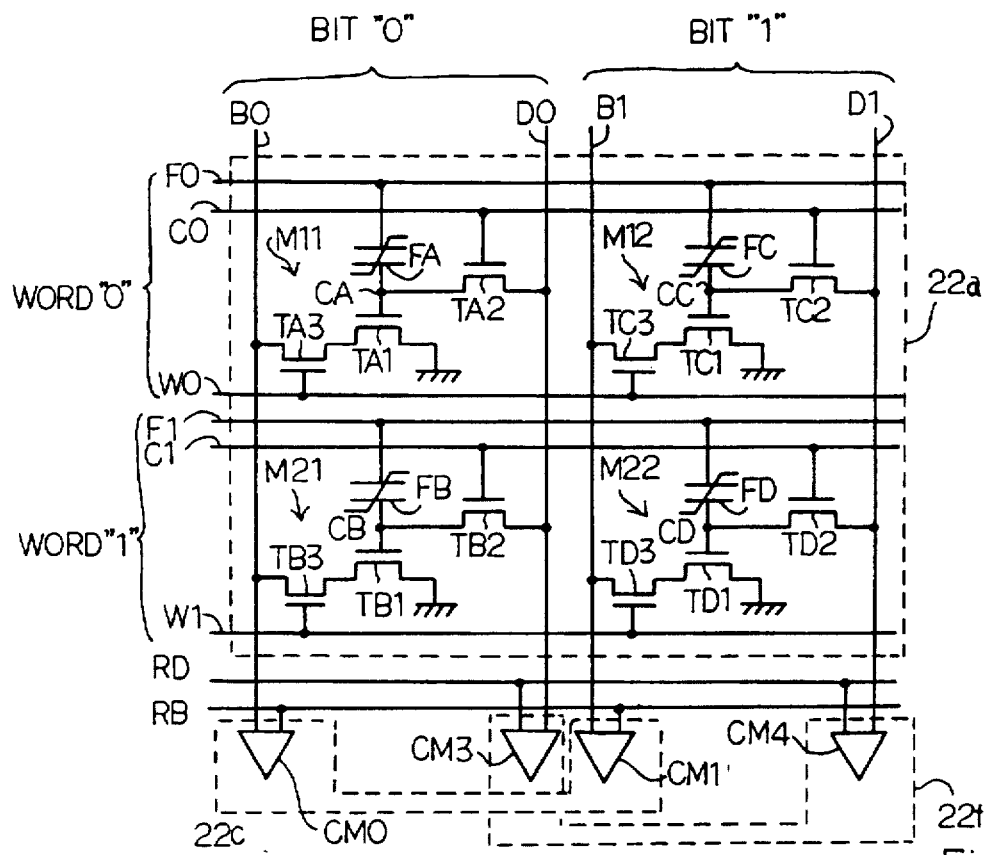
FIG. 8 is a circuit diagram showing the arrangement of a part of the memory cell array incorporated in the non-volatile ferroelectric memory device.

FIG. 8 illustrates a part of the memory cell array 22a. Four memory cells M11, M12, M21 and M22 form the part of the memory cell array 22a. The memory cells M11/M12 and M21/M22 form parts of two rows of the memory cell array 22a, and the two rows are referred to "word 0" and "word 1", respectively. On the other hand, the memory cells M11/M21 and M12/M22 belong to two columns of the memory cell array 22a, and the two columns are respectively referred to "bit 0" and "bit 1". Row addresses are assigned to the two rows of the memory cell array 22a, respectively, and column addresses are assigned to the two columns of the memory cell array 22a, respectively. Therefore, each of the memory cells M11 to M22 is specified with a row address and a column address.

Ferroelectric capacitors FA/FB/FC/FD are corresponding to the ferroelectric capacitor 10, and field effect transistors TA1/TB1/TC1/TD1 behave as similar to the field effect transistor 11. The switching element 12 is implemented by a field effect transistor TA2/TB2/TC2/TD2, and switching transistors TA3/TB3/TC3/TD4 are connected between bit lines B0/B1 and the field effect transistors TA1/TB1/TC1/TD1, respectively. As described hereinbelow, when a data bit is read out from one of the memory cells M11 to M22, the ground potential is applied to selected ferroelectric capacitors, and, for this reason, the field effect transistors TA1 to TD1 are designed to widely change the drain current depending upon the logic level of the data bit under the application of the ground potential.

The bit lines B0/B1 are connected to differential amplifiers CM0/CM1 of the read-out data discriminating circuit 22c, and differential amplifiers CM0/CM1 respectively compare the potential levels on the bit lines B0/B1 with a reference potential on a reference line RB. The switching elements TA2/TB2 and TC2/TD2 are connected to bias lines D0/D1, and differential amplifiers CM3/CM4 compare the potential levels on the bias lines D0/D1 with a reference potential on a reference line RD. Word lines F0/F1 are connected to the ferroelectric capacitors FA/FC and FB/FD, respectively, and the switching transistors TA3/TC3 and TB3/TD3 are gated by word lines W0 and W1, respectively. The switching elements TA2/TC2 and TB2/TD2 are gated by control lines C0 and C1, respectively, and the ground line serves as the bias line SL.

Though not shown in FIG. 8, the bit lines B0/B1, the bias lines D0/D1, the word lines F0/F1 and W0/W1 and the control lines C0/C1 are connected to the driver circuit 22b, and the driver circuit 22b selects one of the bit lines B0/B1 and one of the bias lines D0/D1 on the basis of the column address represented by an address signal supplied from the outside and one of the word lines F0/F1, one of the word lines W0/W1 and one of the control lines C0/C1 on the basis of the row address also represented by the address signal. The non-volatile ferroelectric memory device is powered with a positive potential level Vdd, and the positive potential level Vdd is high enough to polarize the ferroelectric layers of the capacitors FA to FD.

When write-in data bits are stored in word "0", the driver circuit 22b controls the word lines W0/W1, F0/F1, the control lines C0/C1, the bias lines D0/D1 and the bit lines B0/B1 as follows. First, the control line C0 is changed to an active level, and the switching elements TA2/TC2 turn on. The word line W0 is changed to the inactive level, and the switching transistors TA3/TC3 turn off. The word line F0 is grounded, and the positive potential level Vdd and the ground level are selectively supplied to the bias lines D0/D1. The word line F0 is lifted to the positive potential level Vdd, and, thereafter, is decayed to the ground level. Then, a potential difference takes place between the bias lines D0/D1 and the word line F0 at either timing when the word line is changed to the ground level or the positive potential level Vdd. Then, the ferroelectric layer of each capacitor FA/FC is polarized in either direction representative of the logic level of the write-in data bit, and the write-in data bits are stored in the memory cells M11/M12, respectively.

Subsequently, the control line C0 is changed to the inactive level, and the bias lines D0/D1 are changed to the ground level. Thus, the electric charge representative of the data bit is accumulated in the node CA/CC of each memory cell MC11/MC12. When the bias line D0/D1 is biased to the positive potential level Vdd, the amount of electric charge is equal to the total of electric charge induced due to the ferroelectric component and electric charge induced due to the paraelectric component. On the other hand, when the bias line D0/D1 is biased to the ground level, the amount of electric charge is equal to the electric charge induced due to the ferroelectric component.

The other word line F1 is grounded, the control line C1 is maintained at the inactive level, and the word line W1 is maintained at the inactive level.

The data bits stored in word "0" are assumed to be accessed. Upon completion of the data restoring or the previous data refreshing, the control line C0 is maintained at the inactive level, and the switching elements TA2/TC2 are turned off. The word line F0 is grounded, and the driver circuit 22b keeps the bit lines B0/B1 at a certain level low enough not to change the direction of polarization. The certain level may be 0.1 volt. The driver circuit 22b changes the word line W0 to the active level, and the switching transistors TA3/TC3 turn on, and the certain potential level is transferred to the drain nodes of the field effect transistors TA1/TC1. As described hereinbefore, each field effect transistor TA1/TC1 has either high or low threshold representative of the logic level of the data bit stored therein. If the field effect transistor TA1/TC1 has the low threshold, current flows into the ground line, and the bit line B0/B1 is decayed from the certain level. However, when the field effect transistor TA1/TC1 has the high threshold, no current flows into the ground line, and the bit line B0/B1 is maintained at the certain level.

The potential levels on the bit lines B0/B1 are propagated to the differential amplifiers CM0/CM1, and are compared with the reference level. The reference level is regulated to the certain level and the potential level decayed from the certain level, and the differential amplifiers CM0/CM1 supply read-out data signals representative of the logic level of the data bit read out from the memory cell M11 and the logic level of the data bit read out from the memory cell M12 to the input/output circuit 22d.

The driver circuit 22b keeps the word line F1 in the ground level, the control line C1 in the inactive level and the word line W1 in the inactive level. For this reason, the data bits stored in word "1" are not destroyed.

When the non-volatile ferroelectric memory device is powered on, the data restoring circuit 22e prohibits an external device from a data write-in and a data read-out during the data restoring operation, and instructs the driver circuit 22b to read out the remanence of each ferroelectric capacitor FA/FB/FC/FD.

The driver circuit 22b successively checks the ferroelectric capacitors FA/FC of word "0" and the ferroelectric capacitors FB/FD of word "1" to determine the direction of polarization thereof. Description is made on word "0" only.

The driver circuit 22b changes the control line C0 and the word line W0 to the inactive level, and the word line F0 is grounded. The bias lines D0/D1 are grounded. The driver circuit 22b causes the switching elements TA2/TC2 to turn on so as to transfer the ground level to nodes CA/CC.

Subsequently, the driver circuit 22b causes the bias lines D0/D1 to enter into the floating state. After the entry into the floating state, the word line F0 is lifted to the positive potential level Vdd, then the potential level on each bias line D0/D1 is changed to a certain value determined on the basis of the capacitance of the associated ferroelectric capacitor FA/FC and the parasitic capacitance coupled to the bias line D0/D1. When the word line F0 is changed to the positive potential level, the ferroelectric layer of each capacitor FA/FC either inverts or maintains the polarization depending upon the direction of polarization or the logic level of the data bit stored therein. For this reason, each bias line D0/D1 is regulated to one of two potential levels depending upon the logic level of the data bit.

The differential amplifiers CM3/CM4 compare the potential levels on the bias lines D0/D1 with the reference level between the two potential levels, and reports the direction of polarization in the ferroelectric layer of each capacitor FA/FC to the data restoring circuit 22e. The data restoring circuit 22e determines the logic level of the date bit stored in each memory cell M11/M12 at the previous power-off. The data bits may be temporarily stored in the driver circuit 22b.

While the data restoring circuit 22e is checking word "0" to see whether the data bits had logic "1" level or logic "0" level, the driver circuit 22b maintains the word line F1 at the ground level, the control line C1 at the inactive level and the word line W1 at the inactive level, and prevents the ferroelectric capacitors FB/FD from destruction of polarization.

The data read-out destroys the polarization of the ferroelectric capacitors FA/FC. For this reason, the data bits are restored in the memory cells MC11/MC12. The data write-in is similar to the data write-in described hereinbefore. Upon completion of the data restoring, the data restoring circuit 22e allows an external circuit to write data bits into and read out from the memory cell array 22a.

The refresh circuit 22g behaves as follows. The refresh circuit watches a timer to see whether or not certain time period is expired from the previous data refresh and the data restoring. Upon expiry of the certain time period, the refresh circuit 22g prohibits an external device from a data write-in and a data read-out. Thereafter, the refresh circuit 22g requests the driver circuit 22b to read out the data bits stored in one of the words as similar to the data read-out described hereinbefore, and the read-out data bits are written into the word again. After the data write-in, the refresh circuit allows an external device to write data bits into and read out data bits from the memory cell array 22a.

Second Embodiment

The circuit arrangement of another non-volatile ferroelectric memory device is similar to that shown in FIG. 8, and no further description is made on the circuit arrangement of the second embodiment.

Data bits are, by way of example, written into word "0" as follows. The word lines F0/F1 are maintained at the intermediate potential level Vdd/2 except for a data restoring. The word line W0 is changed to an inactive level so that the switching transistors TA3/TC3 are turned off. The positive potential level Vdd and the ground level are selectively supplied to the bias lines D0/D1 depending upon write-in data bits. The control line C0 is changed to an active level so that the switching elements TA2/TC2 turn on. Then, either +Vdd/2 or −Vdd/2 is applied to each of the ferroelectric capacitor FA/FC. The potential level applied to the ferroelectric capacitors FA/FC is selected in such a manner as to be large enough to polarize the ferroelectric layers. Thereafter, the control line C0 is changed to the inactive level so that the switching elements TA2/TC2 turn off. The bias lines D0/D1 are grounded. The nodes FA/FC enters into the floating state under the condition that +Vdd/2 or −Vdd/2 is applied thereto. For this reason, the amount of electric charge accumulated in each node FA/FC is the total of electric charge induced due to the ferroelectric component and electric charge induced due to the paraelectric component regardless of the logic level of the write-in data bit.

As to word "1", the word line F1 is maintained at Vdd/2, the control line C1 is maintained at the inactive level, and the word line W1 is maintained at the inactive level. For this reason, the data write-in for word "0" does not destroy the polarization of the ferroelectric capacitors FB/FD.

The data bits are read out from word "0" as follows. The control line C0 and the word line F0 have been maintained at the inactive level and Vdd/2 from the previous data write-in. The bit lines B0/B1 are changed to a positive potential level low enough not to invert the polarization of the ferroelectric capacitors FA/FC. In this instance, the bit lines B0/B1 are changed to 0.1 volt. The word line W0 is changed to the active level so that the switching transistors TA3/TC3 turn on. The threshold of each field effect transistor TA1/TC1 has been already changed to either high or low threshold level, and the amount of drain current is dependent on the logic level of the data bit stored therein. The potential level on each bit line B0/B1 is determined by the internal resistance of the power source coupled to the bit lines B0/B1 and the channel resistance of the field effect transistor TA1/TC1. The potential levels on the bit lines B0/B1 are propagated to differential amplifiers CM0/CM1, and are compared with a reference potential RB. Thus, the differential amplifiers CM0/CM1 discriminate the logic level of the read-out data bits.

As to word "1", the word line F1 is maintained at Vdd/2, the control line C1 is maintained at the inactive level, and the word line W1 is maintained at the inactive level. For this reason, the data read-out does not destroy the polarization of the ferroelectric capacitors FB/FD, nor changes the amount of electric charge accumulated in each node CB/CD.

When the non-volatile ferroelectric memory device is powered on, the non-volatile ferroelectric memory device reads out the polarization of each ferroelectric capacitor FA/FB/FC/FD, and writes the data bit represented by the polarization into the memory cell. While all the data bits are restored in the memory cells, a data restoring circuit (not shown) prohibits an external device to write a data bit into and read the data bit from the memory cell array 22a.

The control line C0 is changed to the inactive level so that the switching element TA2/TC2 turn off. The word line F0 is grounded, and the word line W0 is changed to the inactive level so that the switching transistors TA3/TC3 turn off. The bias lines D0/D1 are grounded, and the control line C0 is changed to the active level so that the switching elements TA2/TC2 turn on. As a result, the nodes CA/CC are grounded.

The switching elements TA2/TC2 are maintained in the on-state, and the bias lines D0/D1 are changed to the floating state. The word line F0 is lifted to the positive potential level Vdd so that the ferroelectric capacitors FA/FC and the parasitic capacitances coupled to the bias lines D0/D1 determine the potential level on the bias lines D0/D1. The inversion of polarization takes place or does not take place depending upon the direction of polarization of the ferroelectric capacitor FA/FC. For this reason, the potential level on each bias line D0/D1 takes one of two values depending upon the logic level of the data bit stored at the previous power-off. The differential amplifier CM3/CM4 compares the potential level on each bias line D0/D1 with a reference voltage RD, and the data restoring circuit determines the logic level of each data bit previously stored in the memory cell M11/M12. After the data restoring, the word line F0 is maintained at Vdd/2.

As to word "1", the word line F1 is grounded before the data restoring, the control line C1 is maintained at the inactive level, and the word line W1 is maintained at the inactive level. For this reason, the polarization of ferroelectric capacitors CB/CD is never destroyed during the data restoring for word "0".

When the data restoring circuit determines the direction of polarization for each memory cell M11/M12, the data bit represented by the direction of polarization is written into the memory cell M11/M12 as similar to the data write-in described hereinbefore.

In this instance, the word line F0/F1 is not changed during the data write-in, and a data bit is written into the memory cell at higher speed than the first embodiment.

Third Embodiment

Figure 9:
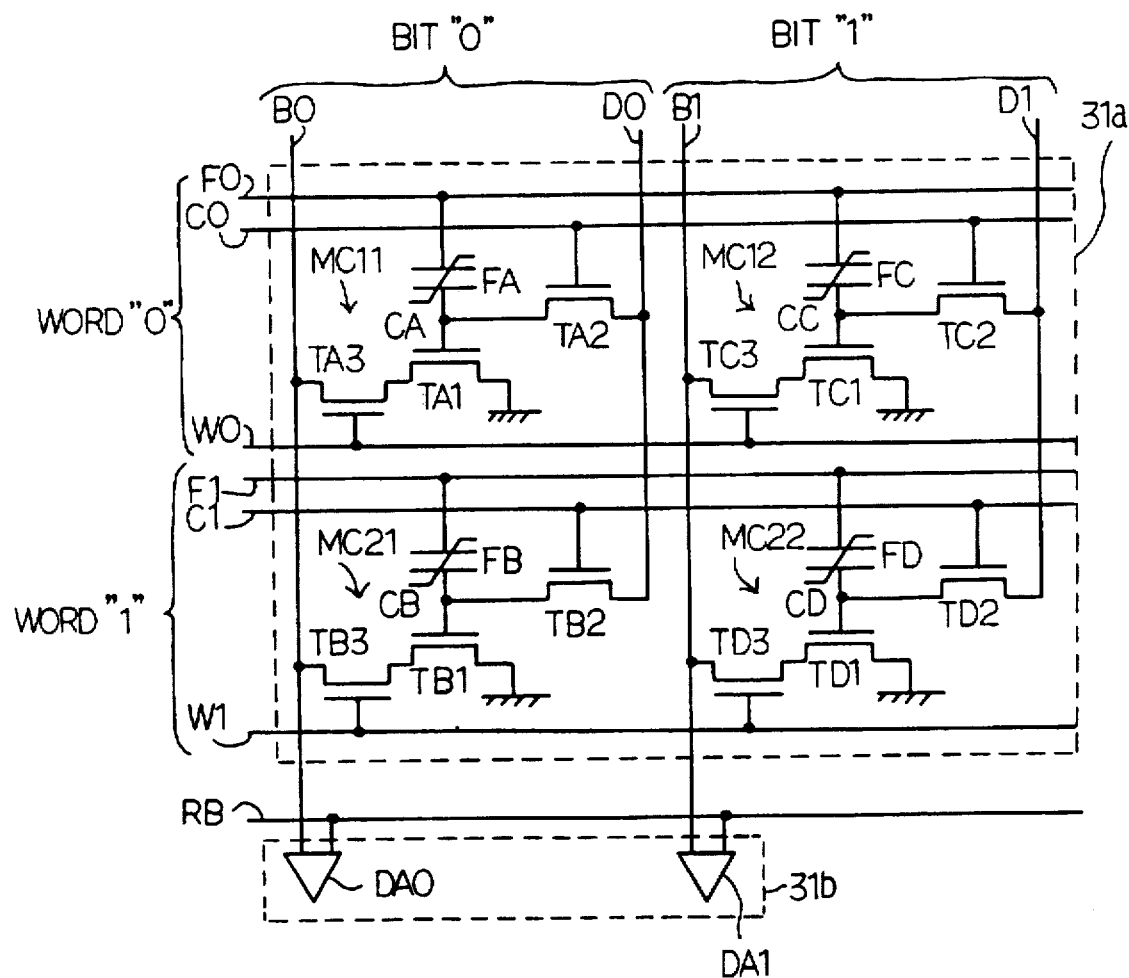
FIG. 9 is a circuit diagram showing the arrangement of a part of the memory cell array incorporated in another non-volatile ferroelectric memory device.

Turning to FIG. 9 of the drawings, memory cells MC11, MC12, MC21 and MC22 are arranged in rows and columns, and form a part of a memory cell array 31a. The memory cell array 31a is incorporated in another non-volatile ferroelectric memory device embodying the present invention. Word lines, bit lines, bias lines and control lines for the memory cells MC11 to MC22 are labeled with the same references as those of the first embodiment. The memory cells MC11/MC12 and MC21/MC22 form word "0" and word "1", and the columns of memory cells MC11/MC21 and MC12/MC22 are referred to as bit "0" and bit "1".

The bit lines B0/B1 are connected to differential amplifiers DA0/DA1 of a read-out data discriminating circuit 31b, and a reference line RB supplies a reference voltage to the differential amplifiers DA0/DA1. Although an input/output circuit, a data restoring circuit, a refresh circuit and a driver circuit are incorporated in the non-volatile ferroelectric memory device, they are similar to those of the first embodiment, and are not detailed for the sake of simplicity. The circuit arrangement shown in FIG. 9 is different from that shown in FIG. 8 in that no differential amplifier is connected to the bias lines D0/D1. For this reason, the non-volatile ferroelectric memory device shown in FIG. 9 is integrated on a semiconductor chip smaller than that shown in FIG. 8.

Data bits are written into and read out from the memory cell 31a as similar to those of the first embodiment.

When the non-volatile ferroelectric memory device is powered on, the data restoring circuit prohibits an external device from a data read-out and a data write-in. The data restoring circuit determines the data bit stored in each memory cell on the basis of the direction of polarization in the ferroelectric capacitor FA/FB/FC/FD. The data bits are concurrently read out from and written into each word.

The control line C0 is changed to an inactive level so that the switching elements TA2/TC2 turn off. The word line F0 is grounded. The second bit lines D0/D1 are also grounded. The control line C0 is changed to an active level so that the switching elements TA2/TC2 turn on, and the nodes CA/CC are grounded.

Subsequently, the control line C0 is changed to the inactive level so that the switching elements TA2/TC2 turn off. The word line F0 is changed to the positive potential level Vdd. Then, an inversion of polarization takes place or does not take place depending upon the direction of polarization left in each ferroelectric capacitor FA/FC. As a result, the node CA/CC takes one of two levels depending upon the logic level of the data at the previous power-off.

The word line F0 is changed to a read-out voltage for the data restoring stage, and the bit lines B0/B1 is biased to about 0.1 volt. The word line W0 is changed to the active level so that the switching transistors TA3/TC3 turn on. The potential level on each bit line B0/B1 is changed to one of two potential levels depending upon the amount of drain current, and the differential amplifiers DA0/DA1 compare the potential level on the bit lines B0/B1 with a reference voltage between the two potential levels. The data restoring circuit determines the logic level of the data bit stored in each memory cell MC11/MC12 at the previous power-off.

As to word "1", the word line F1 is grounded, the control line C1 is maintained at the inactive level, and the word line W1 is also maintained at the inactive level. For this reason, the polarization of each memory cell MC21/MC22 is never destroyed.

After the data read-out, the data bits are stored in word "0" again, and the data write-in is similar to that described hereinbefore. Upon completion of the data restoring, the data restoring circuit allows the external device to write data bits into and read out the data bits from the memory cell array 31a.

Fourth Embodiment

Figure 10:
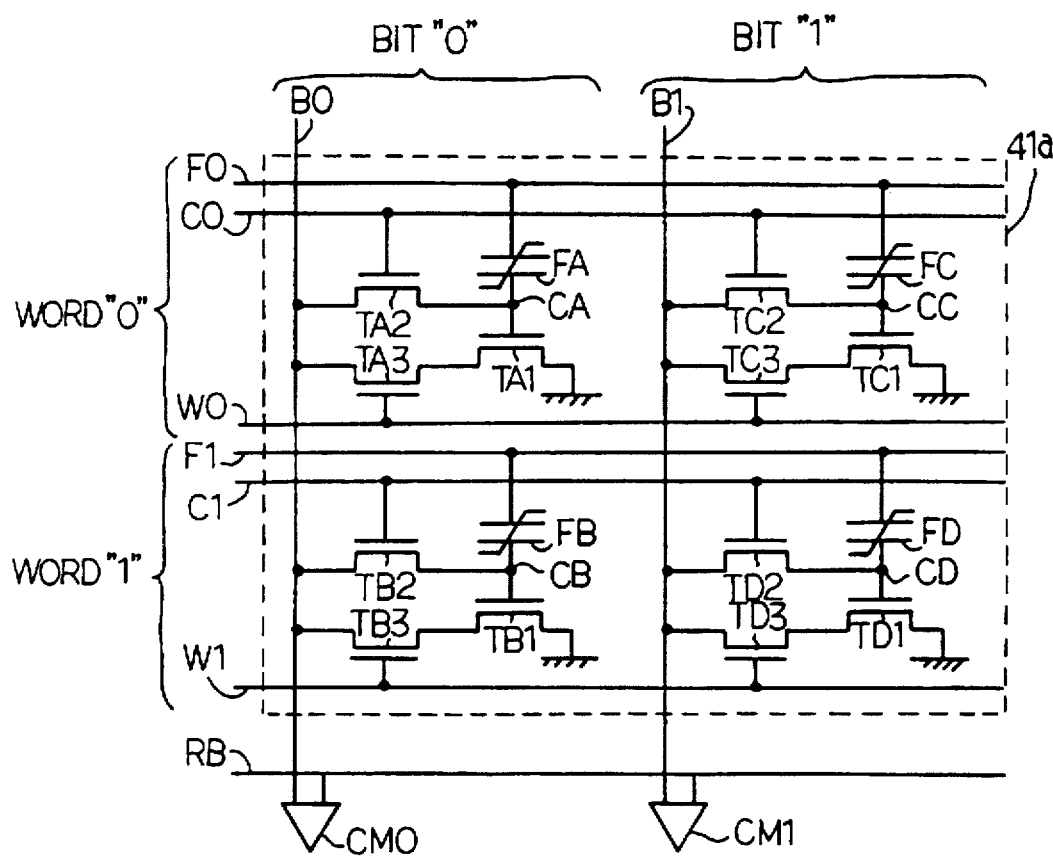
FIG. 10 is a circuit diagram showing the arrangement of a part of the memory cell array incorporated in yet another non-volatile ferroelectric memory device.

FIG. 10 illustrates a part of memory cell array 41a incorporated in yet another non-volatile memory device embodying the present invention. Circuit components and control lines of the third embodiment are labeled with reference signs designating those of the first embodiments corresponding thereto. The third embodiment is different from the first embodiment in that the bias lines D0/D1 and the comparators connected thereto are not incorporated therein. The bit lines B0/B1 further serve as the bias lines D0/D1. For this reason, the non-volatile ferroelectric memory device implementing the third embodiment is fabricated on a semiconductor chip smaller than that of the first embodiment.

Data bits are, by way of example, written into word "0" as follows. The word line W0 is changed to the inactive level so that the switching transistors TA3/TC3 turn off. The word line F0 is grounded, and the positive potential level and the ground level are selectively applied to the bit lines B0/B1 depending upon write-in data bits. The control line C0 is changed to the active level so that the switching elements TA2/TC2 turn on. The word line F0 is lifted to the positive potential level Vdd, and, is thereafter, decayed to the ground level.

Each of the bit lines B0/B1 is biased with respect to the word line F0 at either timing when the word line F0 is changed to the positive potential level Vdd or the ground level. As a result, each of the ferroelectric capacitor CA/CC is polarized in a direction representing the write-n data bit.

Subsequently, the control line C0 is changed to the inactive level so that the switching elements TA2/TC2 turn off, and the bit lines B0/B1 are changed to the ground level. As a result, electric charge is induced at each of the node CA/CC. When the positive potential level Vdd is applied to the bit line B0/B1, the amount of electric charge at the node CA/CC is equal to the total of electric charge induced due to the ferroelectric component and electric charge due to paraelectric component. On the other hand, when the ground level is applied to the bit line B0/B1, the amount of electric charge is equal to the electric charge induced due to the ferroelectric component.

While the data are restored in word "0", the word line F1 is grounded, the control line C1 is maintained at the inactive level, and the word line W1 is maintained at the inactive level. For this reason, each of the ferroelectric capacitors FB/FD maintains the polarization representative of the data bit at the power-off event, and the amount of electric charge at the node CB/CD is not varied.

The data bits are read out from word "0" as follows. The control line C0 is maintained at the inactive level from the last data write-in, and, accordingly, the switching elements TA2/TC2 are turned off. The word line F0 is grounded, and the bit lines B0/B1 are biased to a certain level low enough not to invert the polarization of each ferroelectric capacitor FA/FC. In this instance, the bit lines B0/B1 are biased to 0.1 volt. The word line W0 is biased to the active level so that the switching transistors TA3/TC3 turn on. Each of the field effect transistors TA1/TC1 has been already changed to a high threshold or a low threshold due to the amount of electric charge accumulated in the node CA/CC. The potential level on each bit line B0/B1 is changed to one of two potential levels depending upon the amount of drain current. The potential level on each bit line B0/B1 is propagated to the associated differential amplifier DA0/DA1, and the differential amplifier DA0/DA1 compares the potential level on the bit line B0/B1 with a reference level RB between the two potential levels so as to determine the logic level of the read-out data bit.

While the data bits are being read out from word "0", the word line F1 is grounded, the control line C1 is maintained at the inactive level, and the word line W1 is also maintained at the inactive level. For this reason, the polarization of the ferroelectric capacitor FB/FD is not inverted, and the amount of electric charge at the node FB/FD is not changed.

When the non-volatile ferroelectric memory device is powered on, the data restoring circuit prohibits an external device from a data write-in and a data read-out. Firstly, the direction of polarization is determined for each memory cell of word "0", and a data bit corresponding to the direction is written into the memory cell.

The control line C0 is changed to the inactive level, and the switching elements TA2/TC2 turn off. The word line F0 is grounded, and the word line W0 is changed to the inactive level so that the switching transistors TA3/TC3 turn off. The bit lines B0/B1 are changed to the ground level, the control line C0 is changed to the active level so that the switching elements TA2/TC2 turn on. Then, the nodes CA/CC are grounded.

The switching elements TA2/TC2 are maintained in the on-state, and the bit lines B0/B1 are changed to the floating state. The word line F0 is lifted to the positive potential level Vdd, then each of the bit lines B0/B1 is changed to a potential level determined by the capacitance of the ferroelectric capacitor FA/FC and the parasitic capacitance coupled to the bit line B0/B1. An inversion of polarization takes place or does not take place depending upon the direction of polarization of the ferroelectric capacitor FA/FC, and the potential level on each bit line B0/B1 takes one of the two levels. The potential level on each bit line B0/B1 is compared with a reference level between the two levels, and the differential amplifier DA0/DA1 determines the data bit represented by the direction of polarization.

While the direction of polarization is being examined for each memory cell of word "0", the word line F1 is grounded, the control line C1 is maintained at the inactive level, and the word line W1 is maintained at the inactive level. For this reason, the polarization of each ferroelectric capacitor FB/FD is never changed, and the amount of electric charge at the node FB/FD is not changed.

Thereafter, the data bits each representative of the direction of polarization are written into word "0". The data write-in is similar to that described hereinbefore.

Fifth Embodiment

Figure 11:
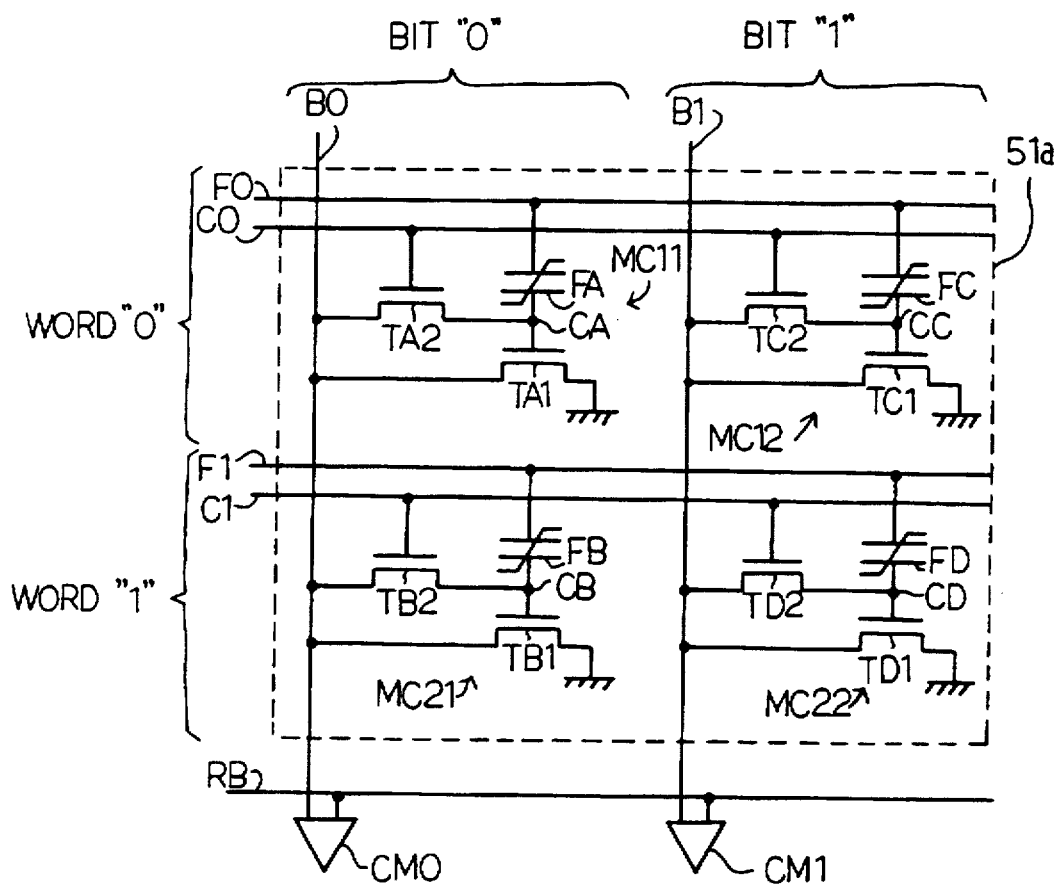
FIG. 11 is a circuit diagram showing the arrangement of a part of the memory cell array incorporated in still another non-volatile ferroelectric memory device.

FIG. 11 illustrates the circuit arrangement of a part of a memory cell array 51a incorporated in still another non-volatile ferroelectric memory device embodying the present invention.

A ferroelectric capacitor FA/FB/FC/FD, a field effect transistor TA1/TB1/TC1/TD1 and a switching element TA2/TB2/TC2/TD2 form the memory cell MC11/MC12/MC21/MC22, and nodes between the ferroelectric capacitors FA to FD and the gate electrodes of the field effect transistors TA1 to TD1 are labeled with CA, CB, CC and CD, respectively.

The field effect transistors TA1/TB1 and TC1/TD1 are connected between the bit lines B0/B1 and the ground line, and the ferroelectric capacitors FA/FC and FB/FD are connected between the word lines F0/F1 and the gate electrodes of the field effect transistors TA1/TC1 and TB1/TD1. The switching elements TA2/TB2 and TC2/TD2 are connected between the nodes CA/CB and CC/CD and the bit lines B0/B1. The switching elements TA2/TC2 and TB2/TD2 are gated by the control lines C0/C1, and the bit lines B0/B1, the word lines F0/F1 and the control lines C0/C1 are biased by the driver circuit (not shown).

The bias lines D0/D1 and the switching transistors TA3–TD3 are deleted from the non-volatile ferroelectric memory device shown in FIG. 10. The non-volatile ferroelectric memory device implementing the fifth embodiment is fabricated on a semiconductor chip smaller than that of the fourth embodiment.

Data bits are written into word "0" as follows. The word line F0 is grounded, and the positive potential level Vdd and the ground level are selectively applied to the bit lines B0/B1 depending upon the write-in data bits. The control line C0 is changed to the active level, and the switching elements TA2/TC2 turn on. The word line F0 is lifted to the positive potential level Vdd, and is, thereafter, decayed to the ground level. Each of the bit lines B0/B1 is biased with respect to the word line F0 at either timing when the positive potential level or the ground level is applied to the word line F0, and the ferroelectric capacitor FA/FC is polarized in a direction corresponding to the logic level of the write-in data bit.

When the data bits are read out from word "0", the word line F0 is biased to a read-out potential level so as to check the field effect transistor TA1/TC1 to see whether the electric charge at the node CA/CC produces a conductive channel or a resistive channel. For this reason, it is necessary to regulate the positive potential level and the transistor characteristics so as to widely vary the drain current.

The control line C0 is changed to the inactive level so that the switching elements TA2/TC2 turn off, and the bit lines B0/B1 are grounded. When the positive potential level Vdd is applied to the bit line B0/B1, the amount of electric charge in the node CA/CC is equal to the total of electric charge induced due to the ferroelectric component and electric charge induced due to the paraelectric component. On the other hand, when the ground level is applied to the bit line B0/B1, only the electric charge due to the ferroelectric component is induced in the node CA/CC.

While the data bits are being written into word "0", the word line F1 is grounded, and the control line C1 is maintained in the inactive level. The polarization of word "1" is not destroyed, and the electric charge at the node CB/CD is not varied. Although the potential is applied to the drain nodes of the field effect transistors TB1/TD1, the electrical influence on the polarization is relatively small, because the electric charge identical in direction with the polarization is accumulated in the nodes CB/CD.

The data bits are read out from word "0" as follows. The control line C0 has been maintained at the inactive level from the previous data write-in. The word line F0 is grounded, and the bit lines B0/B1 are biased to a certain level small enough not to invert the polarization of each ferroelectric capacitor FA/FC. In this instance, the bit lines B0/B1 are biased to 0.1 volt.

The word line F0 is biased to a read-out voltage. The threshold of each field effect transistor TA1/TC1 has been changed due to the electric charge accumulated in the node CA/CC. For this reason, the bit line B0/B1 is changed to one of two potential levels due to the drain current.

Each of the differential amplifiers CM0 and CM1 compares the potential level on the associated bit line B0/B1 with a reference level RB between the two levels, and determines the logic level of the read-out data bit.

While the data bits are being read out from word "0", the word line F1 is grounded, and the control line C1 is maintained at the inactive level. Thus, the polarization of each ferroelectric capacitor FB/FD is not destroyed, and the amount of electric charge at the node CB/CD is never varied.

Although the drain node of each field effect transistor TA1/TC1 is biased by means of the bit line B0/B1, the electric influence is relatively small, because the electric charge in the same direction as the polarization is accumulated in the node CB/CD. As described hereinbefore, the word line F1 is maintained at the ground level during the access to word "0". If the field effect transistors TB1/TD1 allows the current to flow therethrough, the differential amplifiers CM0/CM1 can not exactly determine the logic level of the read-out data bits. For this reason, it is necessary to design the field effect transistors TA1 to TD1 and the ferroelectric capacitors FA to FD in such a manner as not to allow the current to flow therethrough under the above bias condition.

When the non-volatile ferroelectric memory device is powered on, the direction of polarization of each memory cell is examined, and a data bit corresponding to the polarization is written into the memory cell. An external device is prohibited from a data write-in and a data readout until the data restoring is completed.

The direction of polarization is determined as follows. The control line C0 is changed to the inactive level, and the switching elements TA2/TC2 turn off. The word line F0 is grounded. The bit lines B0/B1 are also grounded. Then, the control line C0 is changed to the active level so that the switching elements TA2/TC2 turn on. The nodes CA/CC are grounded. Thereafter, the control line C0 is changed to the inactive level, and the switching elements TA/TC turn off. When the word line F0 is lifted to the positive potential level Vdd, an inversion of polarization takes place or does not take place in each ferroelectric capacitor FA/FC depending upon the direction of polarization at the power-on. As a result, each of the nodes CA/CC is changed to one of the two levels, and the field effect transistors TA1/TC1 change the threshold between a high level and a low level.

The word line F0 is applied with a read-out potential level, and the bit lines B0/B1 is biased to 0.1 volt. The potential level on each bit line B0/B1 is changed depending upon the amount of drain current, and each of the differential amplifiers CM0/CM1 determines the direction of polarization in the ferroelectric capacitor FA/FC.

The other word line F1 is grounded, and the control line C1 is maintained in the inactive level. The potent level on the bit line B0/B1 is applied to the drain nodes of all the field effect transistors TA1 to TD1. After the data restoring, the electric charge in the same direction as the polarization prevents the ferroelectric capacitor from the electric field due to the bit line. However, the electric charge is not accumulated in the node before the data restoring, and the potential level on the bit line decreases the polarization. Therefore, it is necessary to decrease the potential level on the bit lines B0/B1 as small as possible.

After the determination of the direction of polarization, the data bit corresponding to the direction is written into the memory cell, and the external device is allowed to write data bits into and read out the data bits from the memory cell array 51a.

As will be understood from the foregoing description, the method of storing data bits according to the present invention firstly applies a potential level so as to polarize the ferroelectric capacitor between both electrodes thereof, and the node between the ferroelectric capacitor and the field effect transistor is caused to enter the floating state. As a result, a large amount of electric charge is induced in the node by virtue of the ferroelectric component and the paraelectric component. The large amount of electric charge weakens the electric field in the direction opposite to the polarization during a data read-out. For this reason, the memory cell can maintain the data bit for long time period.

Moreover, when the non-volatile ferroelectric memory device is powered on, the direction of polarization is determined for each memory cell, and the data bit corresponding to the direction is written into the memory cell. For this reason, the memory cells form a non-volatile ferroelectric memory device.

Finally, the refresh circuit supplements the electric charge accummualted in the nodes, and the data bits stored therein are highly reliable.

Although particular embodiments of the present invention have been shown and described, it will be obvious to those skilled in the art that various changes and modifications may be made without departing from the spirit and scope of the present invention.

For example, the non-volatile ferroelectric memory device may be integrated on a semiconductor chip together with other function blocks.

What is claimed is:

1. A method of storing a data bit into a memory cell including a capacitor having a ferroelectric layer sandwiched between a first electrode connected to a word line and a second electrode, a field effect transistor having a gate electrode connected to said second electrode and providing one of a conductive channel and a resistive channel between a bit line and a constant potential line and a switching element connected between said gate electrode and a biasing line and gated by a control line, comprising the steps of:

a) causing said switching element to turn on so as to apply a potential difference between said first electrode and said second electrode; and b) causing said switching element to turn off without removal of said potential difference so that an electric charge is accumulated in said second electrode due to a ferroelectric induction and a paraelectric induction.

2. The method as set forth in claim 1, in which said step a) includes the sub-steps of a-1) biasing said second electrode to one of a first potential level representative of a first logic level of a data bit and a second potential level representative of a second potential level of said data bit through said biasing line, a-2) changing said word line from said first potential level to said second potential level at a first timing and, thereafter, from said second potential level to said first potential level at a second timing.

3. The method as set forth in claim 1, in which said step a) includes the sub-steps of a-1) biasing said first electrode through said word line to an intermediate potential level between a first potential level representative of a first logic level of a data bit and a second potential level representative of a second logic level of said data bit, a-2) biasing said second electrode to one of said first potential level and said second potential level through said biasing line.

4. The method as set forth in claim 1, in which a biasing line serves as said biasing line.

5. The method as set forth in claim 1, in which said bit line serves as said biasing line.

6. The method as set forth in claim 1, further comprising the steps of c) applying a read-out potential level to said word line so as to produce one of said conductive channel and said resistive channel between said bit line and said constant potential line, and d) checking a potential level on said bit line to see whether said conductive channel or said resistive channel takes place.

* * * * *